United States Patent
Braun

(10) Patent No.: US 10,158,363 B1
(45) Date of Patent: Dec. 18, 2018

(54) JOSEPHSON AND/OR GATE

(71) Applicant: Alexander Louis Braun, Baltimore, MD (US)

(72) Inventor: Alexander Louis Braun, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 15/811,000

(22) Filed: Nov. 13, 2017

(51) Int. Cl.
*H03K 19/195* (2006.01)
*H03K 19/20* (2006.01)

(52) U.S. Cl.
CPC ........... *H03K 19/195* (2013.01); *H03K 19/20* (2013.01)

(58) Field of Classification Search
CPC ......... H03K 19/195; H03K 3/38; G11C 11/44
USPC ............................................................ 326/3
See application file for complete search history.

(56) References Cited

U.S. PATENT DOCUMENTS

| | | | |
|---|---|---|---|
| 3,094,685 A | 6/1963 | Crowe | |
| 4,956,642 A | 9/1990 | Harada | |
| 5,233,243 A | 8/1993 | Murphy et al. | |
| 6,310,488 B1 | 10/2001 | Hasegawa et al. | |
| 6,608,518 B2 | 8/2003 | Furuta et al. | |
| 6,734,699 B1 | 5/2004 | Herr et al. | |
| 6,756,925 B1 | 6/2004 | Leung et al. | |
| 7,129,869 B2 | 10/2006 | Furuta et al. | |
| 7,227,480 B2 | 6/2007 | Furuta et al. | |
| 7,724,020 B2 | 5/2010 | Herr | |
| 7,786,748 B1 | 8/2010 | Herr | |
| 7,903,456 B2 | 3/2011 | Kirichenko et al. | |
| 7,944,253 B1 | 5/2011 | Kirichenko | |
| 7,969,178 B2 | 6/2011 | Przybysz et al. | |
| 7,977,964 B2 | 7/2011 | Herr | |
| 8,138,784 B2 | 3/2012 | Przybysz et al. | |
| 8,489,163 B2 | 7/2013 | Herr et al. | |
| 8,611,974 B2 | 12/2013 | Maibaum et al. | |
| 9,455,707 B2 | 9/2016 | Herr et al. | |
| 9,543,959 B1 | 1/2017 | Carmean et al. | |
| 9,595,970 B1 | 3/2017 | Reohr et al. | |
| 9,646,682 B1 | 5/2017 | Miller et al. | |
| 9,712,172 B2 | 7/2017 | Shauck et al. | |
| 9,780,765 B2 | 10/2017 | Naaman et al. | |

(Continued)

OTHER PUBLICATIONS

Likharev, K.K. et al.: "RSFQ Logic/Memory Family: A New Josephson-Junction Technology for Sub-Terahertz-Clock-Frequency Digital Systems," IEEE Transactions on Applied Superconductivity, vol. 1 No. 1, Mar. 1991.

(Continued)

*Primary Examiner* — Don Le
(74) *Attorney, Agent, or Firm* — Tarolli, Sundheim, Covell & Tummino LLP

(57) ABSTRACT

A Josephson AND/OR gate circuit makes efficient use of Josephson junction (JJ) and inductor components to provide two-input, two-output AND/OR logical functions. The circuit includes four logical input storage loops that each contain one of two logical decision JJs that are configured such that they trigger to provide the OR and AND signals, respectively. Functional asymmetry is provided in the topologically symmetrical AND/OR gate circuit by a bias storage loop that includes both of the logical decision JJs and that is initialized to store a directional $\Phi_0$ of current at system start-up.

20 Claims, 15 Drawing Sheets

(56) References Cited

U.S. PATENT DOCUMENTS

| | | |
|---|---|---|
| 9,812,192 B1 | 11/2017 | Burnett et al. |
| 9,876,505 B1 | 1/2018 | Dai et al. |
| 9,887,700 B2 | 2/2018 | Carmean et al. |
| 9,905,900 B2 | 2/2018 | Herr et al. |
| 9,917,580 B2 | 3/2018 | Naaman |
| 9,972,380 B2 | 5/2018 | Ambrose |
| 2003/0011398 A1 | 1/2003 | Herr |
| 2003/0016069 A1 | 1/2003 | Furuta et al. |
| 2009/0153180 A1 | 6/2009 | Herr |
| 2011/0133770 A1 | 6/2011 | Przybysz et al. |
| 2016/0164505 A1 | 6/2016 | Naaman et al. |
| 2017/0359072 A1* | 12/2017 | Hamilton ............... H03K 19/21 |

OTHER PUBLICATIONS

U.S. Office Action corresponding to U.S. Appl. No. 15/886,652, dated May 24, 2018.

* cited by examiner

JOSEPHSON AND/OR GATE

TECHNICAL FIELD

The present invention relates generally to quantum and classical digital superconducting circuits, and specifically to a Josephson AND/OR gate.

BACKGROUND

In the field of digital logic, extensive use is made of well known and highly developed complimentary metal-oxide semiconductor (CMOS) technology. As CMOS has begun to approach maturity as a technology, there is an interest in alternatives that may lead to higher performance in terms of speed, power dissipation computational density, interconnect bandwidth, and the like. An alternative to CMOS technology comprises superconductor based single flux quantum circuitry, utilizing superconducting Josephson junctions (JJs), with typical signal power of around 4 nanowatts (nW), at a typical data rate of 20 gigabits per second (Gb/s) or greater, and operating temperatures of around 4 kelvins.

An AND/OR gate is a logical gate having at least two logical inputs and at least two logical outputs, one of the logical outputs representing the AND logical function and another of the outputs representing the OR logical function. The AND output of the AND/OR gate returns an asserted output signal if and only if all of the logical inputs are asserted. The OR output returns an asserted output signal if any one of the logical inputs is asserted.

SUMMARY

One example provides a superconducting AND/OR gate circuit. A first logical input is configured to provide a first input single flux quantum (SFQ) pulse to first and second quantizing storage loops. A second logical input is configured to provide a second input SFQ pulse to third and fourth quantizing storage loops. A DC bias input is configured to provide an initializing SFQ pulse to a fifth quantizing storage loop. A first logical decision Josephson junction (JJ) common to the first, fourth, and fifth quantizing storage loops is configured to assert a first logical output based on the first and second logical inputs both being asserted and to de-assert the first logical output based on either or both of the first or second logical inputs being de-asserted. A second logical decision JJ common to the second, third, and fifth quantizing storage loops is configured to assert a second logical output based on either or both of the first or second logical inputs being asserted and to de-assert the second logical output based on the first and second logical inputs both being de-asserted.

Another example provides a method of determining logical AND and OR values based on SFQ pulse inputs. An initializing current is established in a bias storage loop comprising first and second logical decision JJs in a reciprocal quantum logic (RQL) AND/OR gate. Positive SFQ pulses are provided to assert one or both logical inputs of the RQL AND/OR gate, thereby placing currents in quantizing logical input storage loops in the RQL AND/OR gate and causing one or both logical decision JJs to be triggered. A logical OR assertion signal propagates from an OR output of the RQL AND/OR gate based on one or both logical inputs being asserted. A logical AND assertion signal can also propagate from an AND output of the RQL AND/OR gate based on both logical inputs being asserted.

Another example provides a superconducting gate circuit, which includes a first input configured to provide a first input pulse and a second input configured to provide a second input pulse. The circuit further includes a first storage loop comprising a first quantizing storage inductor interconnecting a first input JJ and a first logical decision JJ, a second storage loop comprising a second quantizing storage inductor interconnecting the first input JJ and a second logical decision JJ, a third storage loop comprising a third quantizing storage inductor interconnecting a second input JJ and the second logical decision JJ, a fourth storage loop comprising a fourth quantizing storage inductor interconnecting the second input JJ and the first logical decision JJ, and a bias storage loop comprising the first and second logical decision JJs. A logical AND output in the circuit is configured to be asserted based on positive input pulses being provided to both the first and second logical inputs. A logical OR output in the circuit is configured to be asserted based on a positive input pulse being provided to at least one of the first and second logical inputs.

DETAILED DESCRIPTION

This disclosure relates generally to logical gate circuits for use in superconducting systems. A two-input, two-output superconducting gate can be configured to provide two logic functions, such as two different logic functions, in response to a pair of inputs. As an example, the two logic functions can correspond to a logic-AND operation and a logic-OR operation on the respective pair of inputs. As an example, the inputs can each be provided via a Josephson transmission line (JTL), such as in a reciprocal quantum logic (RQL) superconducting circuit.

Figure 1:
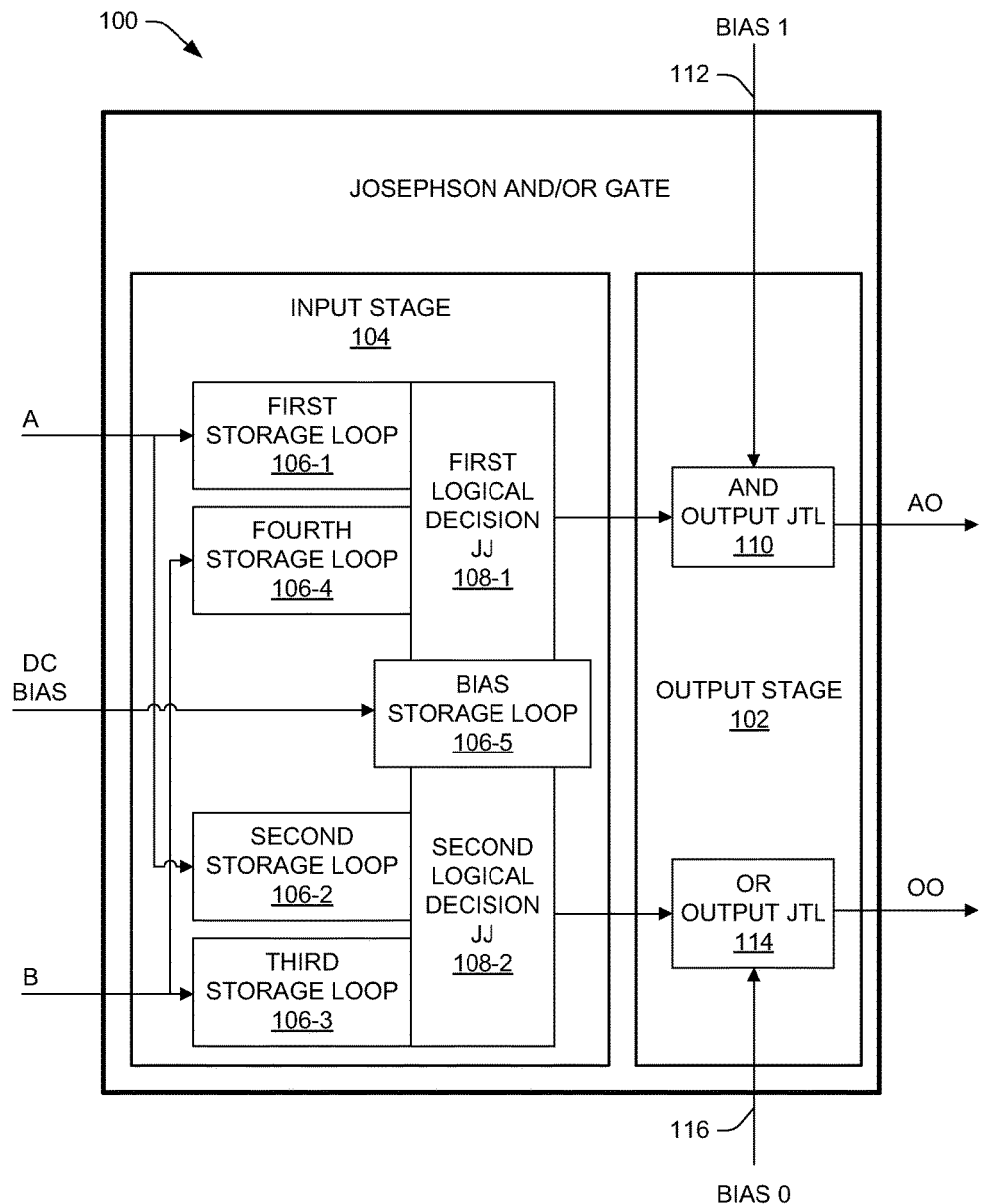
FIG. 1 is a block diagram of an example Josephson AND/OR gate.

FIG. 1 shows an example Josephson AND/OR gate 100 having two logical inputs A and B, and two logical outputs AO and OO, corresponding to a logical AND determination and a logical OR determination, respectively. Gate 100 includes output stage 102, configured to provide outputs AO and OO, and input stage 104, configured to receive inputs A and B, which can consist of positive or negative single flux quantum (SFQ) pulses corresponding to asserted or de-asserted logic states, respectively. Each logical input has associated with it two logical input storage loops among four logical input storage loops 106-1 through 106-4. Logical input A is associated with (e.g., provided to) first storage loop 106-1 and second storage loop 106-2, while logical input B is associated with (e.g., provided to) third storage loop 106-3 and fourth storage loop 106-4. A bias storage loop 106-5 receives a DC bias input which initializes bias storage loop 106-5 at system start-up.

Storage loops 106-1, 106-2, 106-3, 106-4, 106-5 can be quantizing storage loops, by which it is meant that storage elements therein are sized large enough such that stored current alone, even with the AC bias, is insufficient trigger Josephson junctions at either end, such as JJs 108-1 and 108-2. The quantizing nature of the storage loops permits them to stably store a full $\Phi_0$ of current for an arbitrary amount of time until some condition is met.

First logical decision Josephson junction (JJ) 108-1 is common to (i.e., shared by) first and fourth logical input storage loops 106-1, 106-4, as well as bias storage loop 106-5. First logical decision JJ 108-1 triggers based on logical inputs A and B both being asserted. The assertion or de-assertion of output AO is based on the triggering of first logical decision JJ 108-1. For example, output AO can propagate a positive SFQ pulse corresponding to an asserted output logic state when both A and B are asserted, and a negative SFQ pulse corresponding to a de-asserted output logic state when either or both of A or B are de-asserted.

Second logical decision JJ 108-2 is common to (i.e., shared by) second and third logical input storage loops 106-2, 106-3, as well as bias storage loop 106-5. Second logical decision JJ 108-2 triggers based on either or both of logical inputs A or B being asserted. The assertion or de-assertion of output OO is based on the triggering of second logical decision JJ 108-2. For example, output OO can propagate a positive SFQ pulse corresponding to an asserted output logic state when either or both of A or B are asserted, and a negative SFQ pulse corresponding to a de-asserted output logic state when both A and B are de-asserted.

Bias storage loop 106-5 includes both first logical decision JJ 108-1 and second logical decision JJ 108-2. Output stage 102 includes two output Josephson transmission lines (JTLs) 110, 114 to amplify the outputs of logical decision JJs 108-1, 108-2. AND output JTL 110 corresponds to AND output AO, while OR output JTL 114 corresponds to OR output OO. The triggering of logical decision JJs 108-1, 108-2 can be based not only on inputs A and B, but also on bias signals 112, 116 provided to output stage 102, e.g., to output JTLs 110, 114, respectively. Bias signals 112, 116 can provide both AC and DC bias. Thus, for example, bias signals 112, 116 can act as a clock to AND/OR gate 100, causing the evaluation of the inputs A and B to produce the outputs AO, OO at certain points in time according to the AC component of bias signals 112, 116.

Figure 2A:
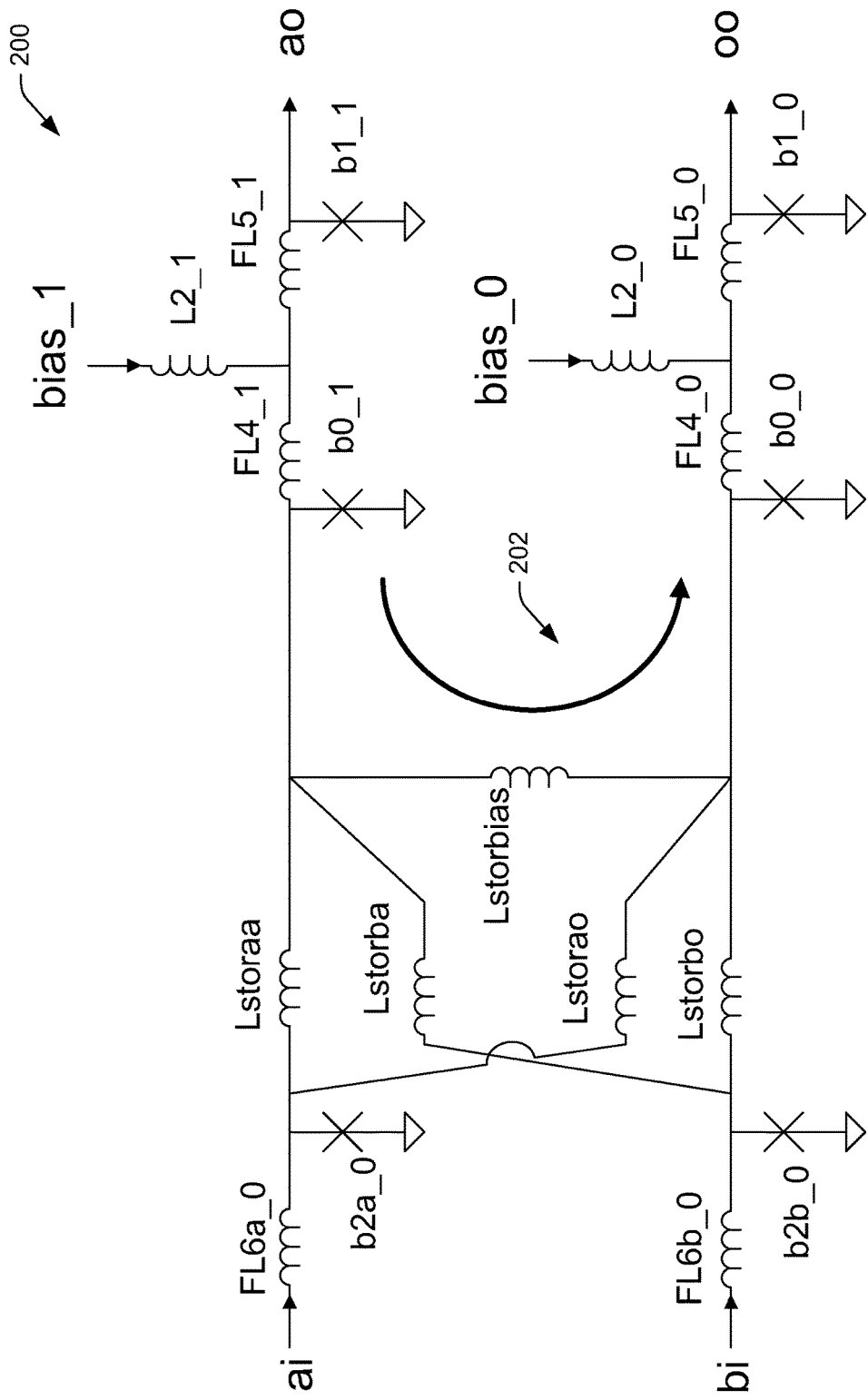
FIGS. 2A-2C are circuit diagrams of example Josephson AND/OR gates.

FIG. 2A shows an example Josephson AND/OR gate 200 having two logical inputs ai and bi, a logical AND output ao, and a logical OR output oo. Circuit 200 encodes logical states as JJ superconducting phase, e.g., a zero phase can represent a de-asserted state ("logic 0" or "logic low") and a $2\pi$ phase can represent an asserted state ("logic 1" or "logic high"). Inputs ai and bi are coupled to relatively small input inductors FL6$a$_0 and FL6$b$_0, respectively. The circuit 200 comprises five storage loops together comprising five storage inductors and four JJs. These storage loops can correspond to loops 106-1 through 106-5 in FIG. 1. Four of the storage loops, i.e., the input storage loops, each comprise one input JJ, one storage inductor, and one logical decision JJ. Accordingly, each of the four JJs is part of two different input storage loops. Two of these JJs, which are herein termed logical decision JJs, are also part of the fifth storage loop. The circuit also includes two output Josephson transmission lines (JTLs), one associated with each of its logical outputs, which receive AC bias signals (e.g., sinusoidal signals) on respective bias lines bias_1 and bias_0.

The storage inductors Lstoraa, Lstorba, Lstorao, Lstorbo, and Lstorbias can be quantizing storage inductors, by which it is meant that they are sized large enough such that stored current alone, even with the AC bias, is insufficient trigger Josephson junctions at either end, e.g., b2$a$_0, b2$b$_0, b0_1, b0_0 as they pertain in pairs to any corresponding loop. The quantizing nature of the storage loops permits them to stably store a full $\Phi_0$ of current for an arbitrary amount of time until some condition is met.

A first storage loop comprises first input JJ b2$a$_0, first storage inductor Lstoraa, and first logical decision JJ b0_1. A second storage loop comprises first input JJ b2$a$_0, second storage inductor Lstorao, and second logical decision JJ b0_0. A third storage loop comprises second input JJ b2$b$_0, third storage inductor Lstorbo, and second logical decision JJ b0_0. A fourth storage loop comprises second input JJ b2$b$_0, fourth storage inductor Lstorba, and first logical decision JJ b0_1. A first output JTL, associated with the logical AND output, consists of first logical decision JJ b0_1, inductors FL4_1, L2_1, and FL5_1, and first output JJ b1_1. A second output JTL, associated with the logical OR output, consists of second logical decision JJ b0_0, inductors FL4_0, L2_0, and FL5_0, and second output JJ b1_0.

Figure 2B:
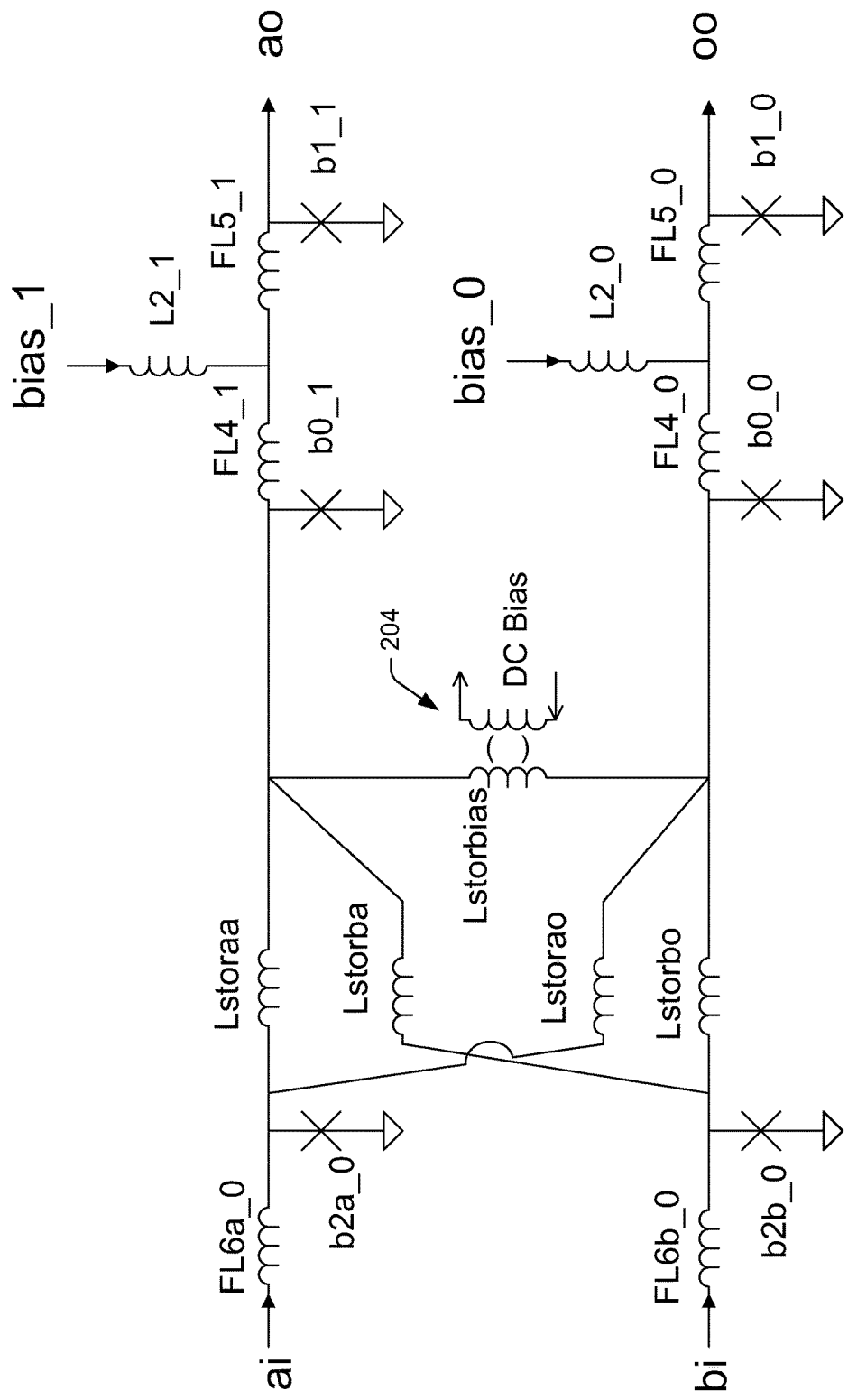
Figure 2C:
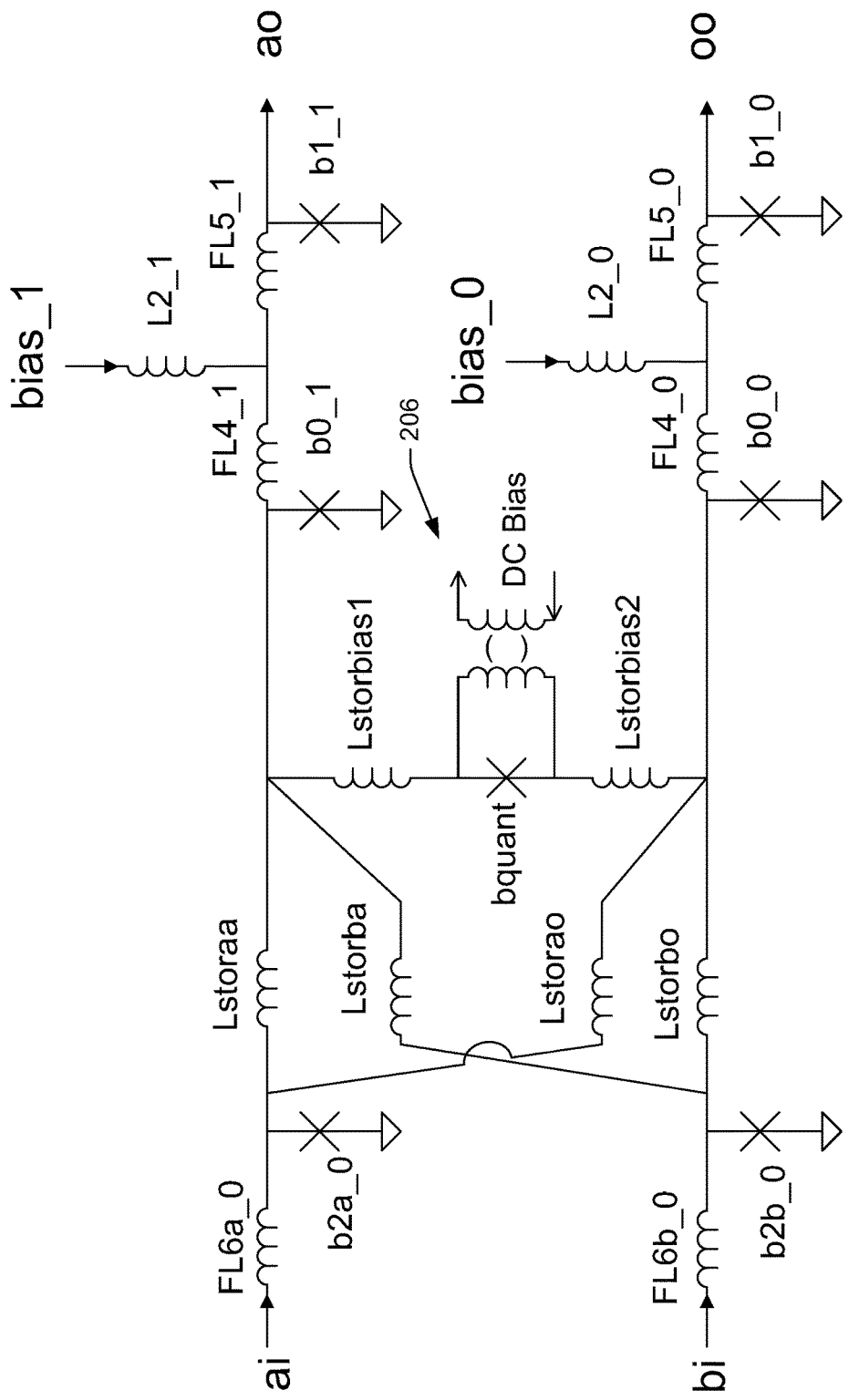

An inductor, bias inductor Lstorbias, is connected between the two logical decision JJs, b0_0 and b0_1, to establish the fifth storage loop, a bias storage loop, that is initialized to a certain state at system start-up. Bias inductor Lstorbias can be slightly smaller than inductors that in a different topology (not shown) might be placed between the upper connections of logical decision JJs b0_1, b0_0 and a low-voltage node (e.g., a ground node), yielding an overall more efficient gate. At startup of the operation of circuit 200, bias inductor Lstorbias can be initialized with application of one $\Phi_0$ of current 202. Such application can be achieved either directly, via a transformer coupling to a DC current 204, as shown in FIG. 2B, or indirectly, via transformer and quantizing JJ 206, as shown in FIG. 2C, or by any other suitable mechanism. In the variation of circuit 200 shown in FIG. 2C, bias inductor Lstorbias is split into two inductors, bias inductors Lstorbias1 and Lstorbias2, in series with and separated by quantizing JJ bquant, which is connected in parallel with a transformer coupling to a DC bias so as to provide the aforementioned initializing current. This current 202 is shown in FIG. 2A as flowing from the AND side of the gate, b0_1, towards the OR side of the gate, b0_0.

With regard to component sizings, as an example, input inductors FL6$a$_0 and FL6$b$_0 can be sized to provide about 8.5 picohenries (pH) of inductance Storage inductors Lstoraa, Lstorba, Lstorao, Lstorbo, and Lstorbias can all be sized, for example, to provide about 35 pH of inductance. Output JTL inductors FL4_1 and FL5_1 can be sized such that their inductances sum to about 14 pH, for example. Similarly, output JTL inductors FL4_0 and FL5_0 can be sized such that their inductances sum to about 14 pH. Bias input inductors L2_1 and L2_0 in the output JTLs can be sized to provide appropriate bias current. The given example component sizings can be scaled proportionately. The AC components of bias signals bias_1 and bias_0 can be the same or about the same phase. By "about," it is meant within tolerances acceptable for circuit functioning as described herein, e.g., ±10%.

Figure 3A:
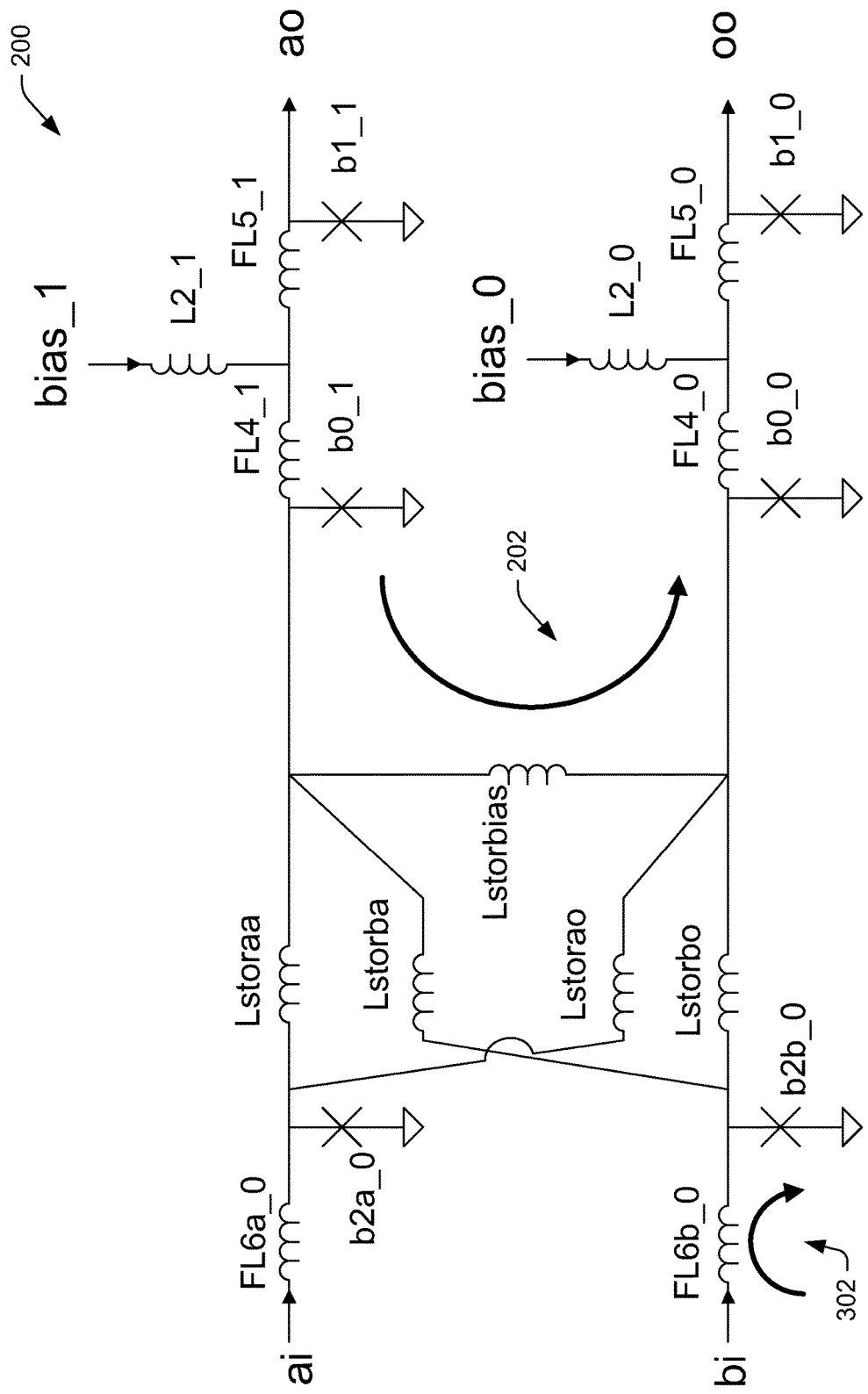
FIG. 3A-3J are annotated circuit diagrams of the example Josephson AND/OR gate of FIG. 2A illustrating its functioning.
Figure 3B:
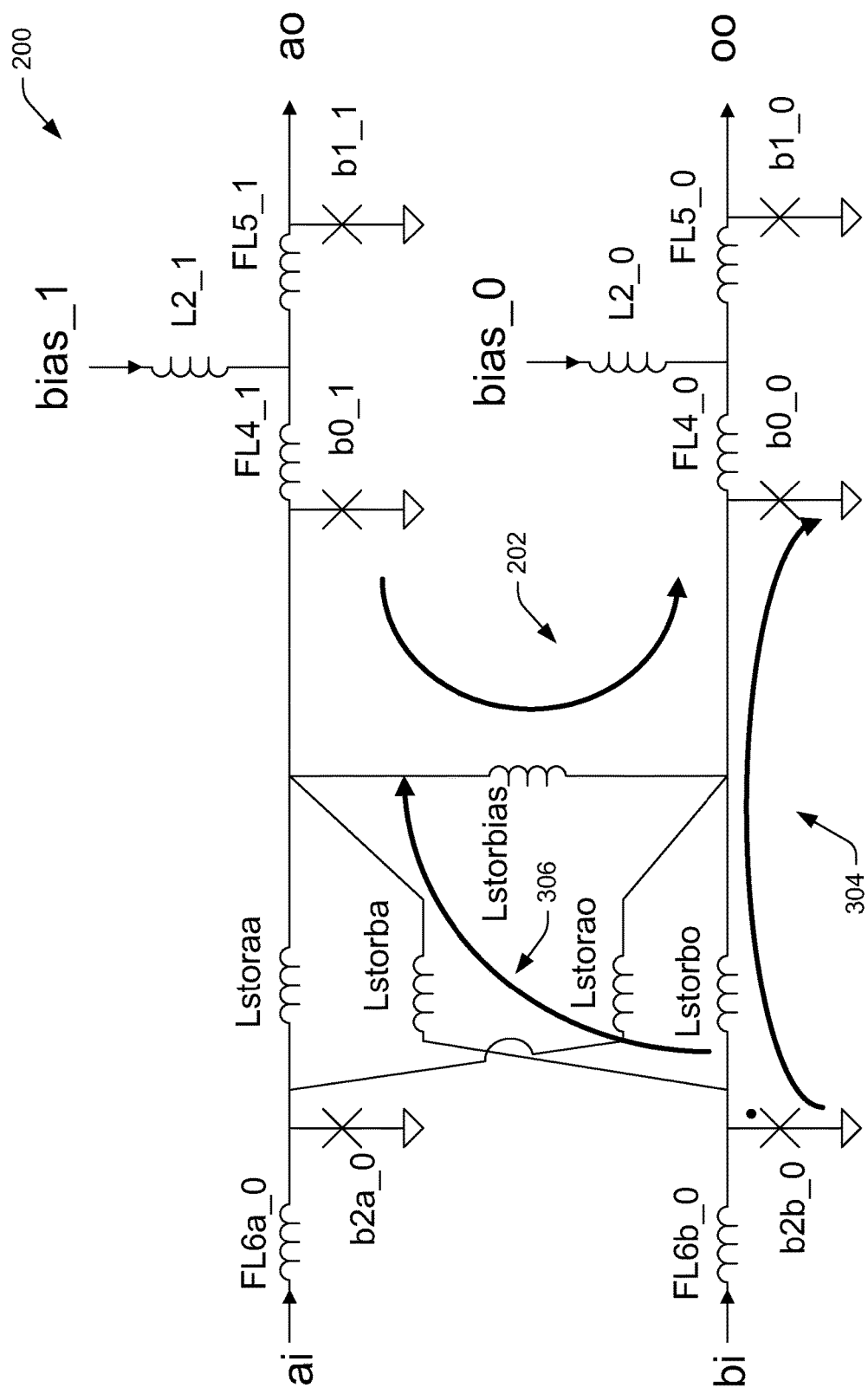

FIGS. 3A through 3J illustrate an example sequence of currents in circuit 200 producing logical outputs consistent with the desired AND/OR functionality. FIG. 3A shows a positive single flux quantum (SFQ) input being applied to second logical input bi, creating current 302 through second input inductor FL6$b$_0 and second input JJ b2$b$_0. In response, as shown in FIG. 3B, the superconducting phase of second input JJ b2$b$_0 is raised from zero to $2\pi$, as indicated by the dot over JJ b2$b$_0 in FIG. 3B. Second input JJ b2$b$_0 is thereby caused to trigger, which has several effects. The triggering annihilates the original input current 302 (not shown in FIG. 3B) by producing an equal and opposite current. The triggering also puts one SFQ of current 304 into the loop formed by second input JJ b2b_0, third storage inductor Lstorbo, and second logical decision JJ b0_0, as well as puts one SFQ of current 306 into the loop formed by second input JJ b2b_0, fourth storage inductor Lstorba, and first logical decision JJ b0_1. Positive bias is thereby applied to both logical decision JJs b0_0 and b0_1. However, because of the current 202 in bias inductor Lstorbias, second logical decision JJ b0_0 now receives two or about two $\Phi_0$ of positive current, while first logical decision JJ b0_1 now receives zero or about zero $\Phi_0$ of positive current, as the two currents 202 and 306 are opposite and equal or about equal.

Figure 3C:
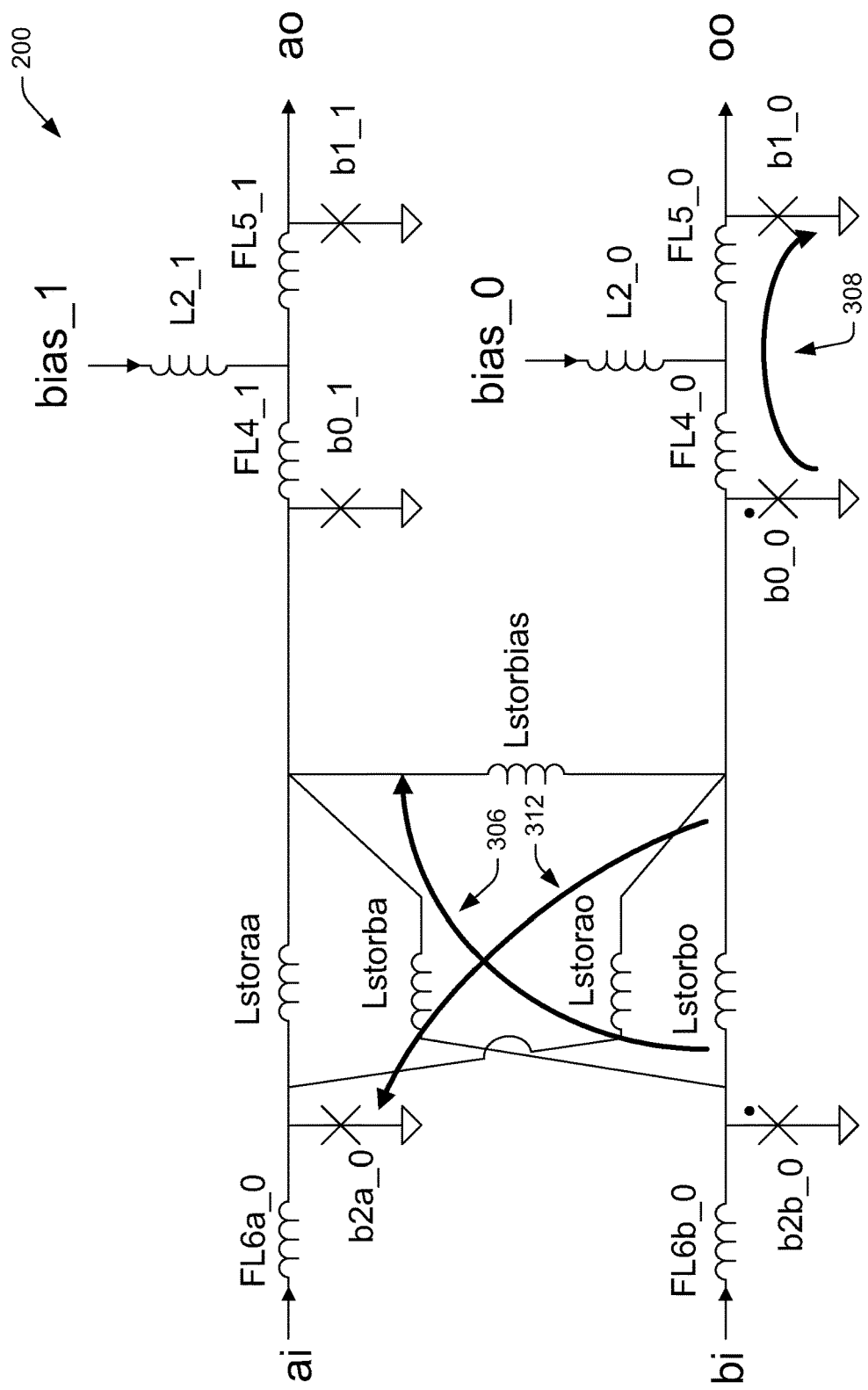
Figure 3D:
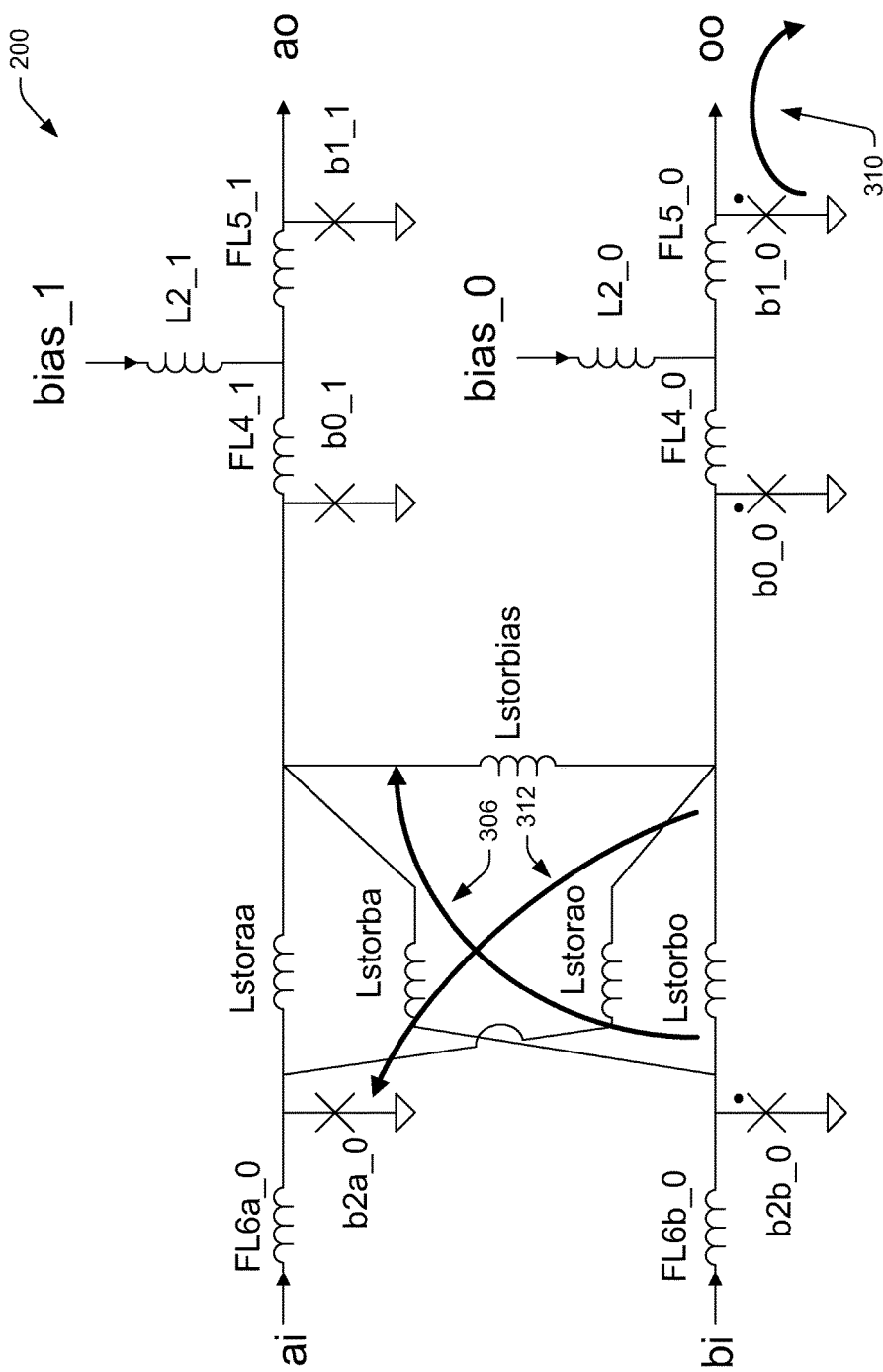

When the AC bias provided by bias lines bias_0 and bias_1 is sufficiently positive, these currents 202 and 304 cause second logical decision JJ b0_0 to trigger, as shown in FIG. 3C. This will drive an SFQ pulse 308 towards second output JJ b1_0, which will then trigger and propagate the pulse 310 out of the logical OR output oo, as shown in FIG. 3D. Additionally, the $\Phi_0$ of current 202 stored in bias inductor Lstorbias (not shown in FIG. 3C or 3D) is removed, and a $\Phi_0$ of current 312 is placed into the loop formed by second logical decision JJ b0_0, second storage inductor Lstorao, and first input JJ b2a_0 flowing towards first input JJ b2a_0.

The above sequence illustrates the result of providing an assertion SFQ pulse 302 on second logical input bi alone: an assertion SFQ pulse 310 on output oo alone. However, an assertion SFQ pulse on first logical input ai alone will not generate an assertion SFQ pulse on output ao alone despite the apparent topological symmetry of circuit 200 with respect to its upper and lower halves. Directional initializing bias current 202 engenders a functional asymmetry that realizes the correct logical functioning of OR and AND outputs oo and ao, respectively. Logical decision JJs b0_1 and b0_0 each effectively operate as a 2-of-3 majority gate with respect to currents in the three storage loops connected to each of them—b0_1 being connected to storage inductors Lstroaa, Lstroba, and Lstorbias, and b0_0 being connected to storage inductors Lstorbo, Lstorao, and Lstorbias. After initialization of bias current 202, second logical decision JJ b0_0, corresponding to the OR output, sees bias current 202 as a positive current on one of its three storage-loop inputs, while first logical decision JJ b0_1, corresponding to the AND output, sees bias current 202 as a negative current on one of its three storage-loop inputs. As a consequence of this functional asymmetry, an assertion SFQ pulse on first logical input ai alone will also generate an assertion SFQ pulse on output oo and not on output ao.

Figure 3E:
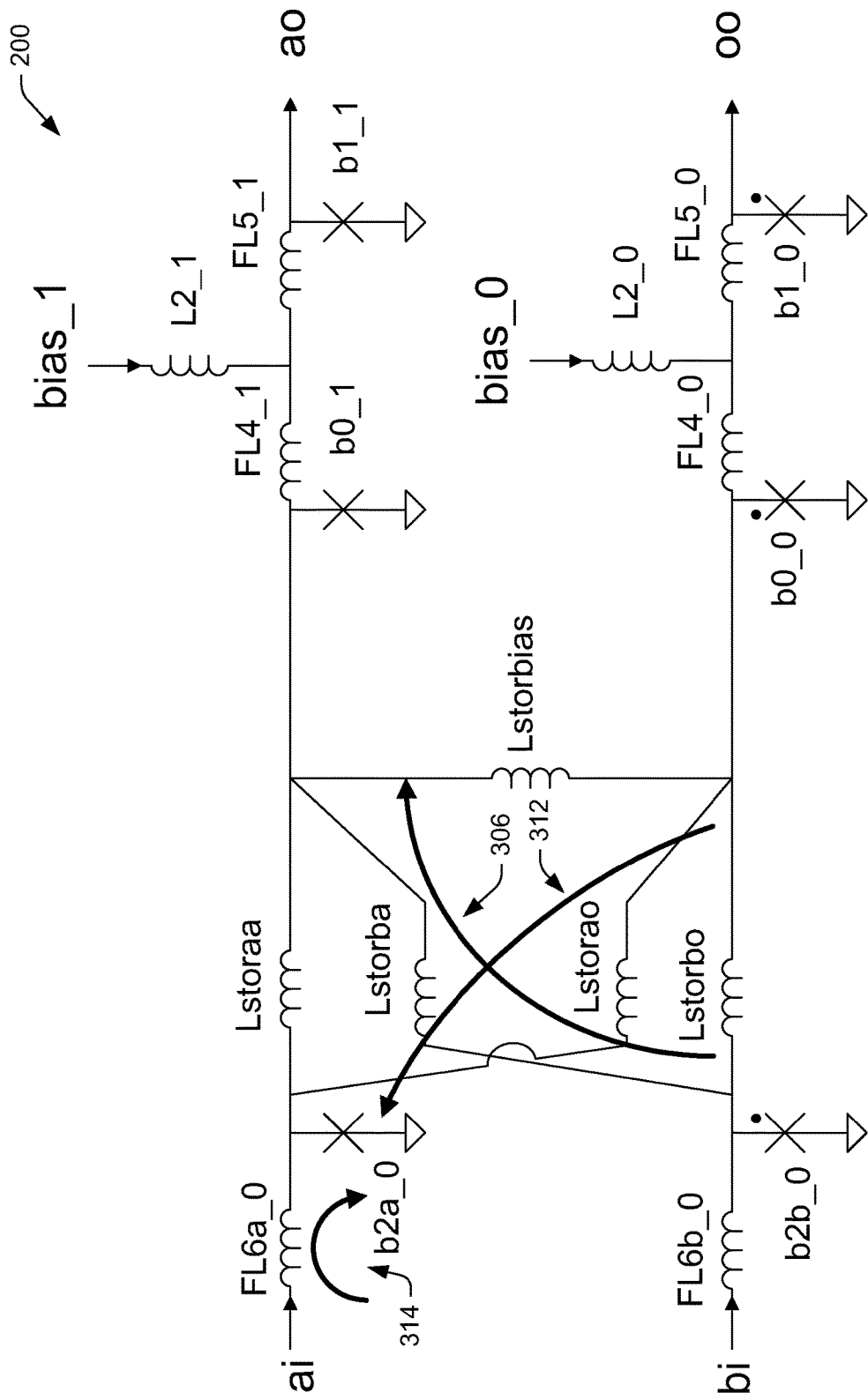
Figure 3F:
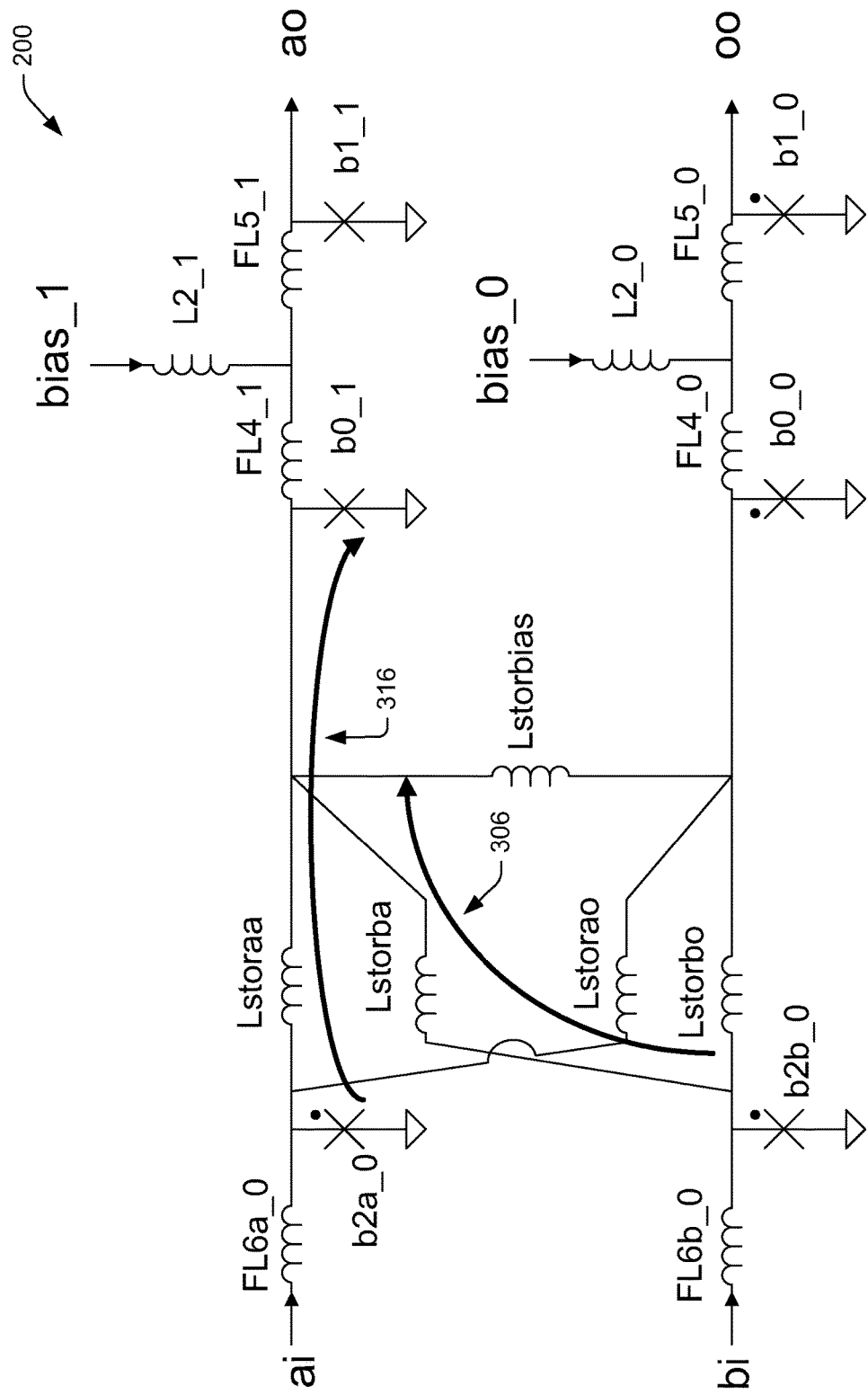
Figure 3G:
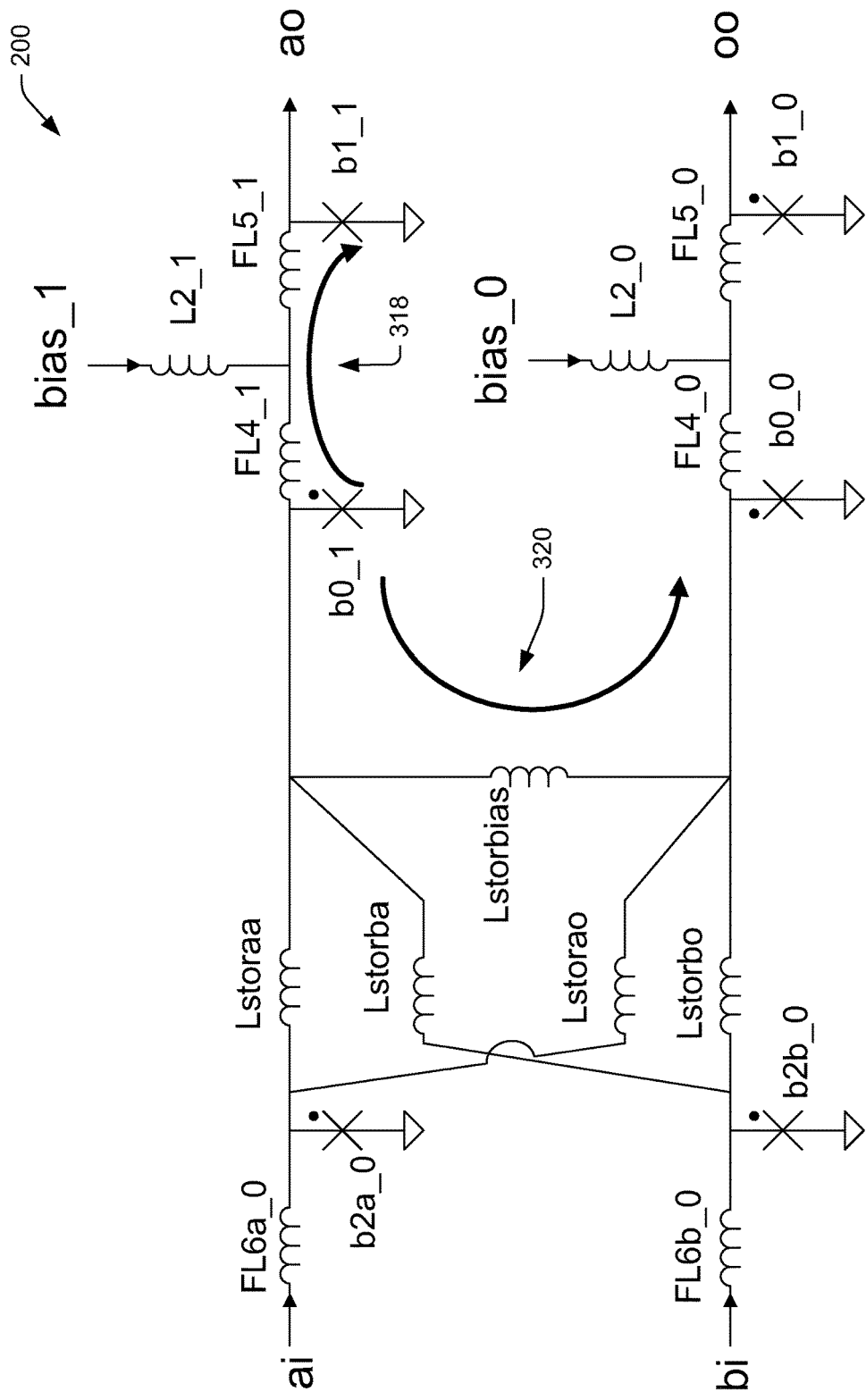

Following from the circuit state established in the previously described sequence, FIG. 3E shows the application of a second positive SFQ input pulse via the first logical input ai to establish current 314. This triggers first input JJ b2a_0, as shown in FIG. 3F, which removes the $\Phi_0$ of current 312 from the second storage loop containing second storage inductor Lstorao and places an SFQ 316 into the first storage loop comprising first input JJ b2a_0, first storage inductor Lstoraa, and first logical decision JJ b0_1, flowing from first input JJ b2a_0 to first logical decision JJ b0_1. Now when the AC bias provided by bias lines bias_0 and bias_1 is sufficiently positive, first logical decision JJ b0_1 receives two $\Phi_0$ of positive current and triggers, as shown in FIG. 3G, driving an SFQ 318 towards first output JJ b1_1, which will then trigger to assert the logical AND output ao by propagating a pulse out that output (not shown). Additionally, it will also destroy current 306 (first generated in FIG. 3B) with an equal and opposite current, and put one $\Phi_0$ of current 320 into bias inductor Lstorbias flowing from first logical decision JJ b0_1 to second logical decision JJ b0_0, restoring this loop to its initial state (i.e., as with current 202 shown in FIGS. 2A and 3A).

Figure 3H:
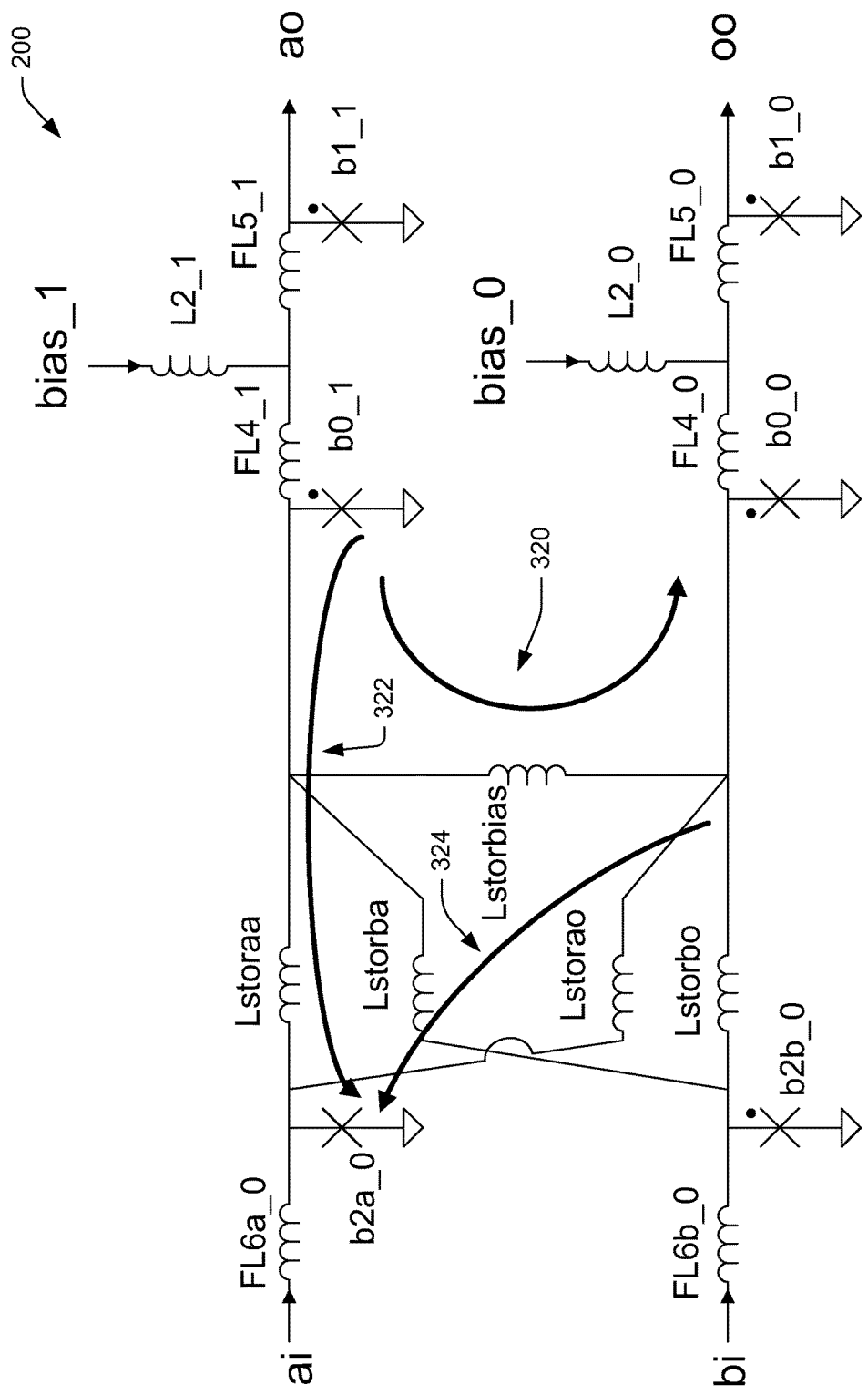
Figure 3I:
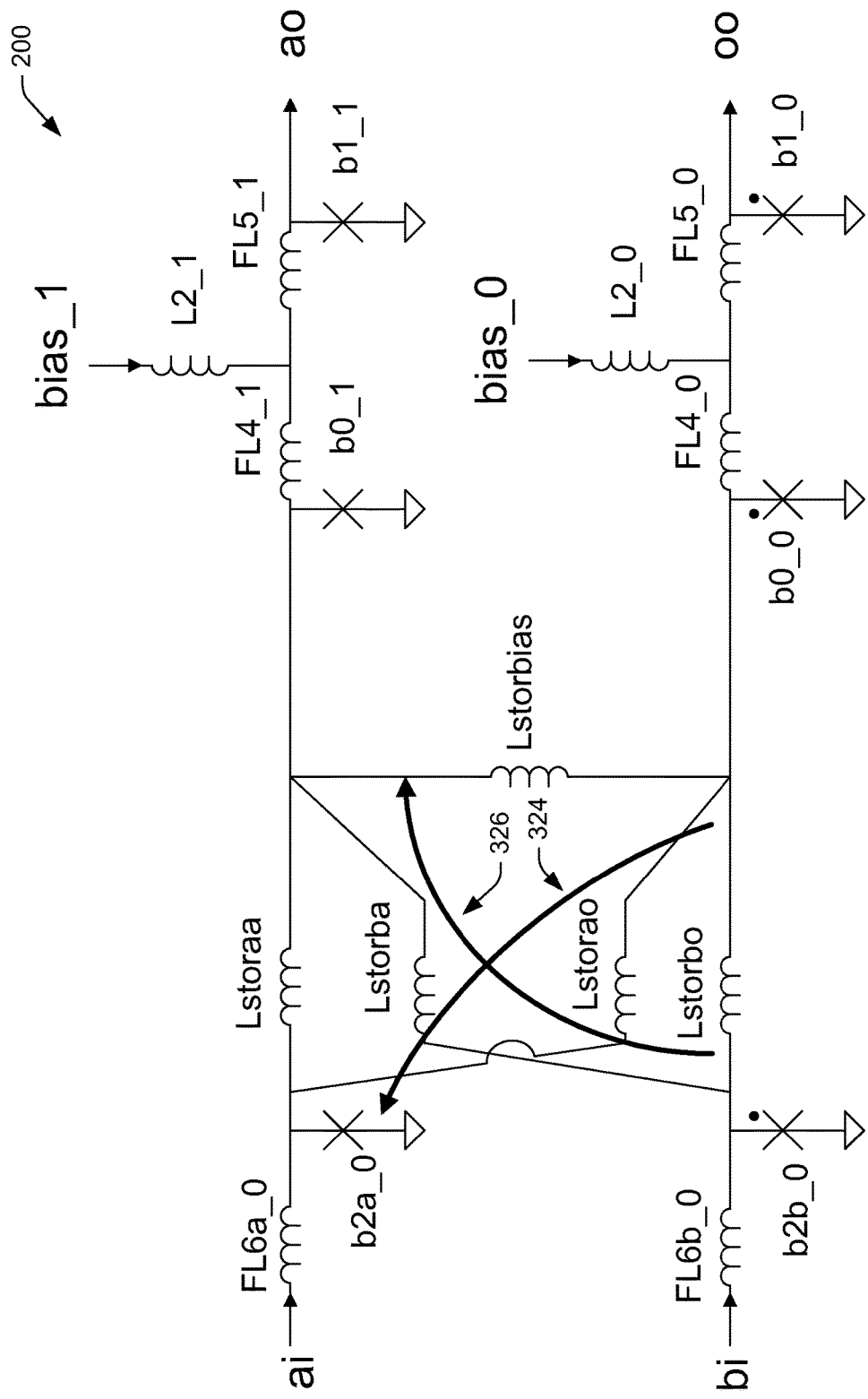
Figure 3J:
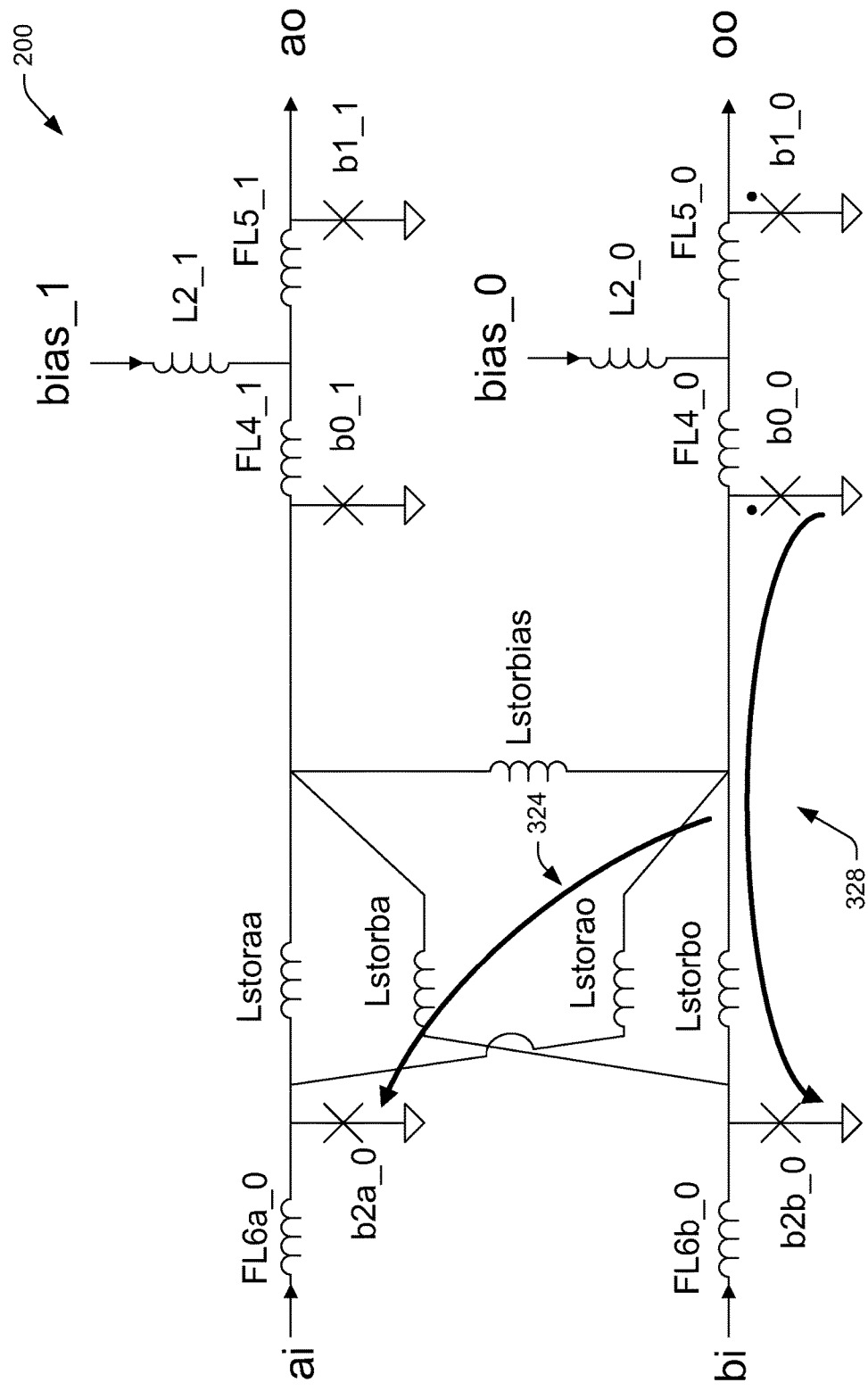

Logical AND output ao is deasserted when one of the inputs is deasserted via the application of a negative SFQ pulse. Applied to either logical input, this pulse will look similar to the initial input application but the direction of the current is reversed, negatively triggering ("untriggering") the respective input JJ and putting current into the internal storage loops in the opposite direction. Following from the circuit state established in the previously described sequence, FIG. 3H shows the state of the circuit after first input JJ b2a_0 has been untriggered to take it from a 2π superconducting phase to a zero superconducting phase following the application of a negative SFQ pulse to first logical input ai. A negative current 322 is established in the first storage loop between input JJ b2a_0, first storage inductor Lstoraa, and first logical decision JJ b0_1. Another negative current 324 is likewise established in the second storage loop between input JJ b2a_0, second storage inductor Lstorao, and second logical decision JJ b0_0.

Then, during the negative portion of the AC cycle (i.e., when the AC bias provided by bias lines bias_0 and bias_1 is sufficiently negative), the AC bias plus the stored currents will sum to untrigger first logical decision JJ b0_1 and deassert logical AND output ao. This will leave the circuit in the state shown in FIG. 3I, which is the same state as the state shown in FIG. 3D after output pulse 310 has exited circuit 200, storage loop currents 324 and 326 in FIG. 3I corresponding to storage loop currents 312 and 306 in FIG. 3D, respectively. The application of a second negative SFQ pulse (not shown) to deassert second logical input bi untriggers second input JJ b2b_0, resulting in the state shown in FIG. 3J, with negative current 328 in third storage loop between second input JJ b2b_0, third storage inductor Lstorbo, and second logical decision JJ b0_0. During the negative portion of the AC clock cycle (i.e., when the AC bias provided by bias lines bias_0 and bias_1 is sufficiently negative), the bias plus the two stored currents untrigger second logical decision JJ b0_0. This untriggering drives a negative SFQ pulse towards second output JJ b1_0, which itself untriggers, propagating a negative output pulse out of logical OR output oo to deassert that output. Additionally, this will put one $\Phi_0$ of current into the loop including bias inductor Lstorbias flowing from first logical decision JJ b0_1 to second logical decision JJ b0_0, corresponding to initial current 202 in FIGS. 2A and 3A, restoring the circuit to its original state.

The above-described circuits can provide a single storage inductor Lstorbias, or two such storage inductors Lstorbias1, Lstorbias2 in series, rather than two separate storage inductors connected to a low-voltage rail (e.g., ground), to perform the same function more efficiently. The improved efficiency of the described AND/OR logic gates can result in denser circuits. The above-described circuits further avoid the need for transformer couplings between storage inductors, permitting the circuit to have a simplified layout that is scalable to smaller process nodes. The described circuit designs can also use a full $\Phi_0$ flux bias current, which is easier to introduce than a fraction of a $\Phi_0$ where a Josephson junction is used to quantize the flux bias, given that a full $\Phi_0$ of current is the natural output of a Josephson junction. The above examples are also capable of storing at least one $\Phi_0$ of current in any of the storage inductors in the storage loops, and in some cases can store $2\Phi_0$.

Figure 4:
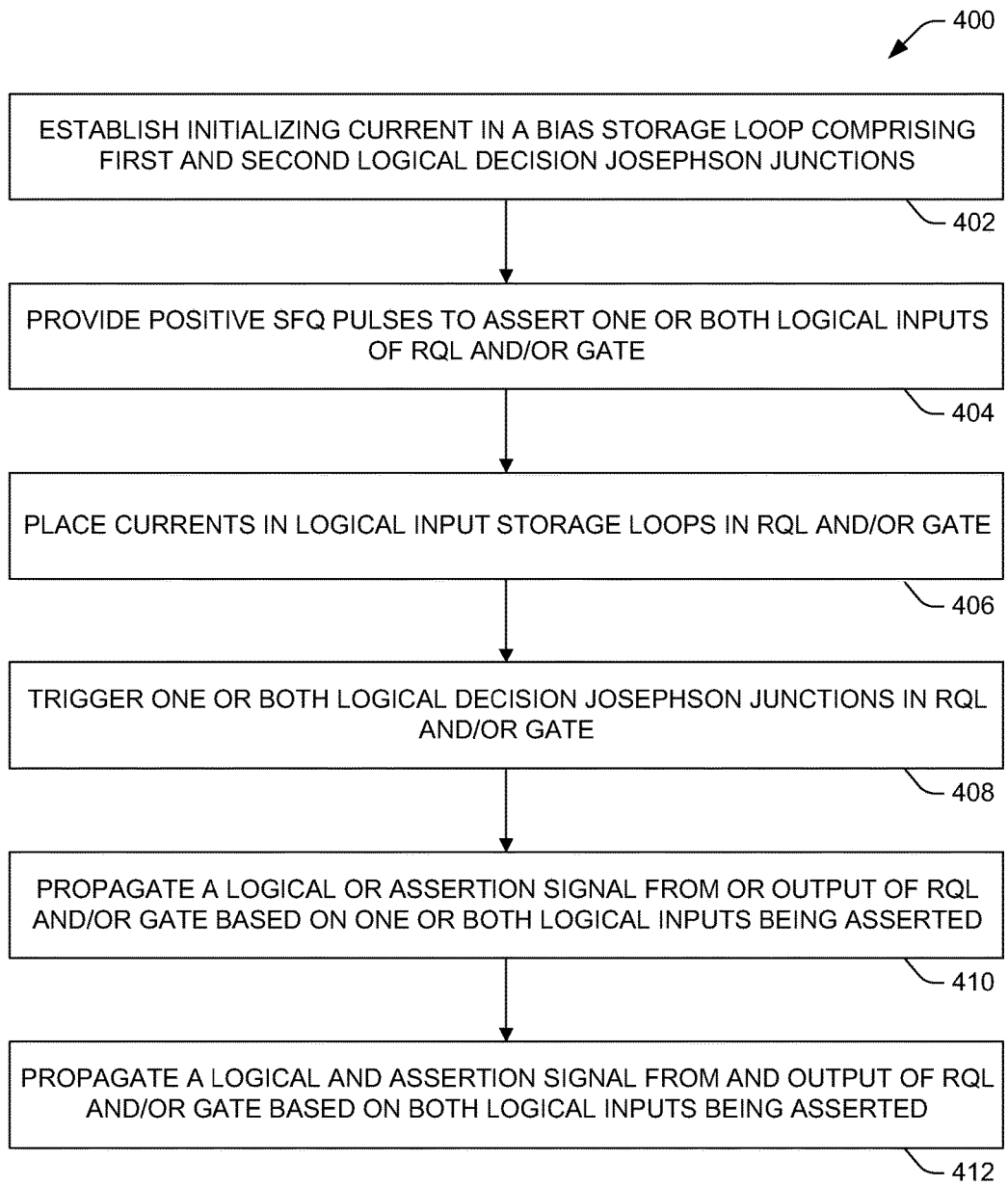
FIG. 4 is a flow chart of an example method of determining logical AND and OR values based on SFQ pulse inputs.

FIG. 4 illustrates an example method 400 of determining logical AND and OR values based on SFQ pulse inputs. An initializing current is established 402 in a bias storage loop comprising first and second logical decision JJs in an RQL AND/OR gate. Positive SFQ pulses are provided 404 to assert one or both logical inputs of the RQL AND/OR gate to place 406 currents in logical input storage loops. The RQL AND/OR gate can be, for example, like gates 100 or 200 shown in FIGS. 1 and 2A, such as the circuits shown in FIG. 2B or 2C, or can be extensions of such examples. Thus, for example, the RQL AND/OR gate used in the method may comprise no more than six JJs and no more than fourteen inductors, as shown in FIG. 2B.

One or both logical decision JJs then trigger 408. For example, a first logical decision JJ can trigger based on both the logical inputs being asserted, and/or a second logical decision JJ can trigger based on one or both the logical inputs being asserted. The second logical decision JJ may trigger further based on the presence of the current established 402 in the bias storage loop. The first logical decision JJ may trigger further based on the absence of the current established 402 in the bias storage loop. The first and second logical decision JJs can be configured to so trigger, for example, by making them common to multiple of the logical input storage loops, by providing appropriate biasing, and/or by appropriate component sizing.

A logical OR assertion signal, generated as a result of the second logical decision JJ triggering, can then propagate 410 from an OR output of the RQL AND/OR gate based on one or both logical inputs being asserted. A logical AND assertion signal, generated as a result of the first logical decision JJ triggering, can then propagate 410 from an OR output of the RQL AND/OR gate based on both logical inputs being asserted. Each of these assertion signals can be, for example, a single SFQ pulse.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A superconducting AND/OR gate circuit comprising:
   a first logical input configured to provide a first input single flux quantum (SFQ) pulse to first and second quantizing storage loops;
   a second logical input configured to provide a second input SFQ pulse to third and fourth quantizing storage loops;
   a DC bias input configured to provide an initializing SFQ pulse to a fifth quantizing storage loop,
   a first logical decision Josephson junction (JJ) common to the first, fourth, and fifth quantizing storage loops, configured to assert a first logical output based on the first and second logical inputs both being asserted and to de-assert the first logical output based on either or both of the first or second logical inputs being de-asserted;
   a second logical decision JJ common to the second, third, and fifth quantizing storage loops, configured to assert a second logical output based on either or both of the first or second logical inputs being asserted and to de-assert the second logical output based on the first and second logical inputs both being de-asserted.

2. The circuit of claim 1, further comprising first and second output Josephson transmission lines (JTLs) configured to amplify the first and second logical outputs, respectively.

3. The circuit of claim 2, further comprising bias inputs to the output JTLs configured to induce respective bias currents in the logical decision JJs based on bias signals.

4. The circuit of claim 3, wherein the assertion of the first and second logical outputs is further based on the bias currents.

5. The circuit of claim 1, wherein each storage loop is configured to store a superconducting current based on the assertion of inputs.

6. The circuit of claim 1, wherein
   the first quantizing storage loop comprises a first quantizing storage inductor interconnecting a first input JJ and the first logical decision JJ,
   the second quantizing storage loop comprises a second quantizing storage inductor interconnecting the first input JJ and the second logical decision JJ,
   the third quantizing storage loop comprises a third quantizing storage inductor interconnecting a second input JJ and the second logical decision JJ, and
   the fourth quantizing storage loop comprises a fourth quantizing storage inductor interconnecting the second input JJ and the first logical decision JJ.

7. The circuit of claim 6, wherein the fifth quantizing storage loop comprises a bias inductor interconnecting the first logical decision JJ and the second logical decision JJ.

8. The circuit of claim 7, wherein the bias inductor is transformer-coupled to the DC bias input.

9. The circuit of claim 6, wherein the fifth quantizing storage loop comprises a series arrangement interconnecting the first logical decision JJ and the second logical decision JJ, the series arrangement comprising a parallel arrangement interconnecting a first bias inductor and a second bias inductor, the parallel arrangement comprising a quantizing JJ and an inductor that is transformer-coupled to the DC bias input.

10. A method of determining logical AND and OR values based on SFQ pulse inputs, the method comprising:
    establishing an initializing current in a bias storage loop comprising first and second logical decision Josephson junctions (JJs) in a reciprocal quantum logic (RQL) AND/OR gate;
    providing positive SFQ pulses to assert one or both logical inputs of the RQL AND/OR gate;
    placing currents in quantizing logical input storage loops in the RQL AND/OR gate;
    triggering one or both logical decision JJs;
    propagating a logical OR assertion signal from an OR output of the RQL AND/OR gate based on one or both logical inputs being asserted.

11. The method of claim 10, wherein the logical OR assertion signal is generated as a result of the second logical decision JJ triggering.

12. The method of claim 11, wherein the second logical decision JJ triggering is further based on the presence of the current established in the bias storage loop.

13. The method of claim 10, further comprising:
propagating a logical AND assertion signal from an AND output of the RQL AND/OR gate based on both logical inputs being asserted.

14. The method of claim 13, wherein the logical AND assertion signal is generated as a result of the first logical decision JJ triggering.

15. The method of claim 14, wherein the first logical decision JJ triggering is further based on the absence of current in the bias storage loop.

16. The method of claim 10, wherein the triggering of the one or both logical decision JJs is based on an AC bias provided by at least one bias lines being sufficiently positive.

17. The method of claim 10, wherein the RQL AND/OR gate comprises no more than six JJs and no more than fourteen inductors.

18. A superconducting gate circuit comprising:
a first input configured to provide a first input pulse;
a second input configured to provide a second input pulse;
a first storage loop comprising a first quantizing storage inductor interconnecting a first input Josephson junction (JJ) and a first logical decision JJ;
a second storage loop comprising a second quantizing storage inductor interconnecting the first input JJ and a second logical decision JJ;
a third storage loop comprising a third quantizing storage inductor interconnecting a second input JJ and the second logical decision JJ;
a fourth storage loop comprising a fourth quantizing storage inductor interconnecting the second input JJ and the first logical decision JJ;
a bias storage loop comprising the first and second logical decision JJs;
a logical AND output configured to be asserted based on positive input pulses being provided to both the first and second logical inputs; and
a logical OR output configured to be asserted based on a positive input pulse being provided to at least one of the first and second logical inputs.

19. The circuit of claim 18, wherein the logical AND and logical OR outputs are configured to be asserted further based on the presence or absence of current in the bias storage loop.

20. The circuit of claim 18, wherein the bias storage loop further comprises an inductor interconnecting the first and second logical decision JJs, the inductor being configured to initialize the bias storage loop to hold one $\Phi_0$ of current at startup.

* * * * *